US008603272B2

(12) United States Patent
Prejean et al.

(10) Patent No.: US 8,603,272 B2
(45) Date of Patent: *Dec. 10, 2013

(54) MULTILAYER FILMS CONTAINING A FLUORINATED COPOLYMER RESIN LAYER AND AN ENCAPSULANT LAYER

(75) Inventors: George Wyatt Prejean, Orange, TX (US); Sam Louis Samuels, Landenberg, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 130 days.

This patent is subject to a terminal disclaimer.

(21) Appl. No.: 13/194,521

(22) Filed: Jul. 29, 2011

(65) Prior Publication Data

US 2012/0024351 A1 Feb. 2, 2012

Related U.S. Application Data

(60) Provisional application No. 61/369,628, filed on Jul. 30, 2010.

(51) Int. Cl.
*B32B 37/02* (2006.01)
*B32B 27/08* (2006.01)

(52) U.S. Cl.
USPC .............. 156/60; 156/326; 428/421; 428/422

(58) Field of Classification Search
USPC ............................ 156/60, 326; 428/421, 422
See application file for complete search history.

(56) References Cited

U.S. PATENT DOCUMENTS

| | | | |
|---|---|---|---|
| 3,030,290 A | 4/1962 | Ryan | |
| 5,415,909 A | 5/1995 | Shohi et al. | |
| 5,723,543 A | 3/1998 | Modic | |
| 6,204,443 B1 | 3/2001 | Kiso et al. | |
| 6,323,416 B1 | 11/2001 | Komori et al. | |
| 6,414,236 B1* | 7/2002 | Kataoka et al. ............... | 136/251 |
| 6,753,087 B2 | 6/2004 | Jing et al. | |
| 6,762,508 B1 | 7/2004 | Kiso et al. | |
| 6,797,222 B2 | 9/2004 | Hausmann et al. | |
| 6,963,120 B2 | 11/2005 | Shiozaki et al. | |
| 6,972,068 B1 | 12/2005 | Kobayashi et al. | |
| 7,638,186 B2 | 12/2009 | Hull et al. | |
| 8,211,264 B2 | 7/2012 | Samuels | |
| 8,211,265 B2 | 7/2012 | Samuels | |
| 2007/0267059 A1 | 11/2007 | Nishijima et al. | |
| 2008/0023063 A1 | 1/2008 | Hayes et al. | |
| 2008/0023064 A1 | 1/2008 | Hayes et al. | |
| 2008/0169023 A1 | 7/2008 | Nishijima et al. | |
| 2008/0264471 A1 | 10/2008 | Hayes | |
| 2008/0264481 A1 | 10/2008 | Hayes | |
| 2009/0120489 A1 | 5/2009 | Nishijima et al. | |
| 2009/0151773 A1* | 6/2009 | Hayes et al. .................. | 136/251 |
| 2009/0183773 A1 | 7/2009 | Samuels et al. | |
| 2009/0255571 A1 | 10/2009 | Xia et al. | |
| 2010/0129665 A1 | 5/2010 | Chou | |
| 2011/0023943 A1 | 2/2011 | Prejean | |
| 2011/0297313 A1 | 12/2011 | Samuels | |
| 2011/0297314 A1 | 12/2011 | Samuels | |
| 2012/0024348 A1 | 2/2012 | Prejean et al. | |
| 2012/0024450 A1 | 2/2012 | Samuels et al. | |
| 2012/0028049 A1 | 2/2012 | Prejean et al. | |
| 2012/0152323 A1 | 6/2012 | Perry et al. | |

FOREIGN PATENT DOCUMENTS

| | | |
|---|---|---|
| EP | 0577985 B1 | 2/1997 |
| EP | 1182710 B1 | 6/2006 |
| EP | 1065731 B1 | 5/2011 |
| FR | 2539419 A1 | 7/1984 |
| JP | 2000-186114 A | 7/2000 |
| JP | 2001-144313 A | 5/2001 |
| JP | 2004-031445 A | 1/2004 |
| JP | 2004-058583 A | 2/2004 |
| JP | 2006-032308 A | 2/2006 |
| JP | 2006-190867 A | 7/2006 |
| JP | 2008-026614 A | 6/2008 |
| WO | 2004/019421 A1 | 3/2004 |

OTHER PUBLICATIONS

Pern et al., Adhesion Strength Study of EVA Encapsulants on Glass Substrates, NCPV and Solar Program Review Meeting, 2003, NREL/CD-520-33586.
Hoppe et al., Organic Solar Cells: An Overview, Journal of Materials Research, vol. 19, No. 7, Jul. 2004, pp. 1924-1945.
PCT International Search Report and Written Opinion for International Application No. PCT/US2011/045859 dated Nov. 16, 2011.
PCT International Preliminary Report on Patentability for International Application No. PCT/US2011/045859 dated Feb. 5, 2013.

* cited by examiner

*Primary Examiner* — Michael Bernshteyn
(74) *Attorney, Agent, or Firm* — Maria M. Kourtakis; Kelly Law Registry; Linda K. H. Sauebrunn

(57) ABSTRACT

A multilayer film comprises a layer consisting essentially of a fluorinated copolymer resin film and a layer consisting essentially of a blend of two ethylene copolymers. The first ethylene copolymer comprises copolymerized units of ethylene, optionally a first olefin having the formula $CH_2=C(R^1)CO_2R^2$, and a second olefin having the formula $CH_2=C(R^3)COOH$. The second ethylene copolymer consists essentially of copolymerized units of ethylene, optionally a first olefin having the formula $CH_2=C(R^1)CO_2R^2$, and a third olefin having the formula $CH_2=C(R^4)D$. $R^1$, $R^3$ and $R^4$ represent hydrogen or an alkyl group; $R^2$ represents an alkyl group; and D represents a moiety containing an epoxy group. The multilayer film is useful as an integrated frontsheet or backsheet for photovoltaic modules. Methods for preparing the multilayer film and the photovoltaic modules are also included.

14 Claims, No Drawings

MULTILAYER FILMS CONTAINING A FLUORINATED COPOLYMER RESIN LAYER AND AN ENCAPSULANT LAYER

CROSS-REFERENCE TO RELATED APPLICATION

This application claims priority under 35 U.S.C. §119 to U.S. Provisional Appln. No. 61/369,628, filed on Jul. 30, 2010, which is incorporated herein by reference in its entirety.

FIELD OF THE INVENTION

The invention is directed to multilayer film structures comprising a layer comprising a fluorinated copolymer resin and a layer of an ethylene copolymer blend and methods for preparing the structure. The invention is further directed to methods for preparing photovoltaic modules that comprise the multilayer films.

BACKGROUND OF THE INVENTION

Several patents and publications are cited in this description in order to more fully describe the state of the art to which this invention pertains. The entire disclosure of each of these patents and publications is incorporated by reference herein.

Photovoltaic (PV) modules (also known as solar modules) are used to produce electrical energy from sunlight, offering a more environmentally friendly alternative to traditional methods of electricity generation. Such modules are based on a variety of semiconductor cell systems that can absorb light and convert it into electrical energy. These systems are typically categorized into two types based on the light absorbing material used, i.e., bulk or wafer-based modules and thin film modules. Typically, individual cells are electrically connected in an array to form a module, and an array of modules can be connected together in a single installation to provide a desired amount of electricity.

When the light absorbing semiconductor material in each cell and the electrical components used to transfer the electrical energy produced by the cells are suitably protected from the environment, photovoltaic modules can last 25, 30, and even 40 or more years without significant degradation in performance. In a typical photovoltaic module construction, the solar cell layer is positioned between two encapsulant layers, which are further positioned between frontsheet and backsheet layers providing weather resistance, UV resistance, moisture barrier properties, low dielectric constant, and high breakdown voltage.

Fluoropolymer films are recognized as important components in photovoltaic modules due to their excellent strength, weather resistance, UV resistance, moisture barrier properties, low dielectric constant, and high breakdown voltage and can play a role in both wafer-based and thin film modules. For example, a fluoropolymer film, such as an ethylene-tetrafluoroethylene copolymer (ETFE) film, may be used as a frontsheet for a photovoltaic module instead of the more common glass layer. Challenges associated with using a fluoropolymer film as a frontsheet include providing the desired combination of barrier properties and transparency, as well as providing good adhesion to an adjacent encapsulant layer. For instance, higher transparency will improve solar module efficiency in converting sunlight into electricity, but achieving higher transparency typically requires the use of thinner fluoropolymer films, which reduces strength, weather resistance, UV resistance, and moisture barrier properties. Furthermore, the reduced barrier properties of thinner films can result in more rapid degradation of the encapsulant layer, further reducing the overall performance of the module. ETFE films have become the most widely used fluoropolymer materials for manufacture of photovoltaic (PV) module frontsheets due to the excellent adhesion of ETFE to ethylene vinyl acetate copolymers (EVA).

EVA copolymers are the most commonly used materials for the encapsulant layer, due to their low cost, high clarity, low modulus, low initial viscosity, low equilibrium moisture level, and good heat resistance. In addition, EVA copolymers have been favored encapsulant materials because they are characterized by low melting temperatures, which allows them to readily flow around and seal the solar cell components. The low melting temperature properties of EVA copolymers, however, generally necessitate subsequent crosslinking of the polymer to provide suitable thermal stability of the resulting photocells.

Moreover, the use of crosslinkable EVA as an encapsulant is not trouble-free. For example, the liberation of acetic acid from EVA can lead to corrosion and yellowing of the EVA encapsulant. Also, because peroxides are often incorporated in the EVA encapsulant as part of the crosslinking reaction, the shelf life of the EVA encapsulant is reduced and decomposition of the peroxide results in evolution of oxygen which may cause bubble formation. Finally, it is necessary that the EVA sheet be produced at a very low extrusion temperature to prevent premature crosslinking, that is, crosslinking prior to lamination to form the solar cell module.

Therefore, alternative materials that exhibit higher thermal dimensional stability without crosslinking are of interest for use in encapsulant layers.

In the past, encapsulant materials have been compounded with silane coupling agents, including aminosilanes, to improve adhesion to fluoropolymer layers. (See e.g. U.S. Pat. Nos. 6,963,120 and 6,762,508; U.S. Patent Application Publication Nos. 2009/0183773, 2009/0120489, 2009/0255571, 2008/0169023, 2008/0023063, 2008/0023064 and 2007/0267059; U.S. Patent Application Publn. No. 2011/0023943; European Patent Application No. 1065731; French Patent No. 2539419 and Japanese Patent Application Nos. 2000/186114, 2001/144313, 2004/031445, 2004/058583, 2006/032308 and 2006/190867). U.S. Pat. No. 6,753,087 describes a multilayer structure including a fluoropolymer bonded to a substrate. The structure is prepared by heating a bonding composition including an amino-substituted organosilane to form a bond. U.S. Patent Application Publication Nos. 2008/0023063, 2008/0023064, 2008/0264471 and 2008/0264481 describe solar cells in which one or both surfaces of any of the solar cell laminate layers may be treated with a silane that incorporates an amine function. U.S. Patent Application Publn. No. 2011/0297313, entitled "Method for Preparing Transparent Multilayer Film Structures Having a Perfluorinated Copolymer Resin Layer", filed Jun. 7, 2010, and U.S. Patent Application Publn. No. 2011/0297314, entitled "Method for Preparing Multilayer Structures Containing a Perfluorinated Copolymer Resin Layer", filed Jun. 7, 2010, describe the use of aminosilanes as surface-treatment agents or additives for ethylene copolymer films adhered to fluoropolymer films useful as PV module components.

U.S. Pat. No. 7,638,186 and European Patent Application Publication No. EP577985 describe the use of tetrafluoroethylene-hexafluoropropylene copolymers, commonly referred to as FEP, as back sheet layers in photovoltaic modules. International Patent Application Publication No. WO2004/019421 describes the use of FEP as a front sheet layer in photovoltaic modules.

There is a need for alternative encapsulant materials for use in photovoltaic modules that incorporate fluoropolymer films. Such materials would desirably exhibit a combination of good adhesion to fluoropolymer layers, particularly under adverse conditions, and high light transmittance, thereby enabling development of improved photovoltaic modules.

SUMMARY OF THE INVENTION

The present invention provides a transparent multilayer film laminate comprising:
a transparent multilayer film comprising:
  A. a first film layer comprising a fluorinated copolymer resin composition wherein i) the fluorinated copolymer comprises copolymerized units of tetrafluoroethylene and copolymerized units of comonomers selected from the group consisting of ethylene, perfluorinated comonomer, and combinations thereof, and ii) at least one surface of the first film layer has been modified by a surface treatment; and
  B. a second film layer consisting essentially of a blend composition, said blend composition consisting essentially of an Ethylene Copolymer 1 and an Ethylene Copolymer 2;
    wherein said Ethylene Copolymer 1 consists essentially of copolymerized units of ethylene; optionally copolymerized units of a first olefin having a formula of $CH_2=C(R^1)CO_2R^2$; and copolymerized units of a second olefin having a formula of $CH_2=C(R^3)COOH$; and
    wherein said Ethylene Copolymer 2 consists essentially of copolymerized units of ethylene; optionally copolymerized units of the first olefin; and copolymerized units of a third olefin having a formula of $CH_2=C(R^3)D$;
    wherein $R^1$ represents hydrogen or an alkyl group; $R^2$ represents an alkyl group; $R^3$ represents hydrogen or an alkyl group; and D represents a moiety selected from the group consisting of $-CO_2R^4$, $-CO_2R^5-R^4$, $-R^5-R^4$, $-O-R^4$, and $-R^4$, wherein $R^4$ represents a moiety containing an epoxy group and $R^5$ represents an alkylene group;
wherein a surface of the second film layer is adhered to the modified surface of the first film layer and the multilayer film laminate is characterized by i) having an average peel strength between the first film layer and the second film layer of greater than 5 lbf/in, measured after exposing the multilayer film laminate to conditions of 85° C. and 85% relative humidity for 1000 hours.

The transparent multilayer film may be used as an integrated frontsheet or backsheet in a photovoltaic module. Accordingly, further provided herein are photovoltaic modules comprising or produced from the multilayer films and methods for making the multilayer films and the photovoltaic modules.

DETAILED DESCRIPTION

The following definitions are used herein to further define and describe the disclosure. These definitions apply to the terms as used throughout this specification, unless otherwise limited in specific instances.

Unless otherwise defined, all technical and scientific terms used herein have the same meaning as commonly understood by one of ordinary skill in the art to which this invention belongs. In case of conflict, the specification, including definitions, will control.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The transitional phrase "consisting" of excludes any element, step, or ingredient not specified in the claim, closing the claim to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" limits the scope of a claim to the specified materials or steps and those that do not materially affect the basic and novel characteristic(s) of the claimed invention. A 'consisting essentially of' claim occupies a middle ground between closed claims that are written in a 'consisting of' format and fully open claims that are drafted in a 'comprising' format. Optional additives as defined herein, at levels that are appropriate for such additives, and minor impurities are not excluded from a composition by the term "consisting essentially of".

When a composition, a process, a structure, or a portion of a composition, a process, or a structure, is described herein using an open-ended term such as "comprising," unless otherwise stated the description also includes an embodiment that "consists essentially of" or "consists of" the elements of the composition, the process, the structure, or the portion of the composition, the process, or the structure.

The term "substantially free", as used herein with respect to a composition and a component, refers to a composition that includes no more than an adventitious amount of the component. Stated alternatively, the composition includes no added amount of the component, only the amount that is commonly present in the raw materials from which the composition is produced. In some commercially available materials, the level of adventitious components is less than less than 2.5%, 1.0%, less than 0.5%, or less than 0.1% by weight, based on the weight of the commercially available material.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). Exclusive "or" is designated herein by terms such as "either A or B" and "one of A or B", for example.

The term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

In addition, the ranges set forth herein include their endpoints unless expressly stated otherwise. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. The scope of the invention is not limited to the specific values recited when defining a range.

When materials, methods, or machinery are described herein with the term "known to those of skill in the art", "conventional" or a synonymous word or phrase, the term signifies that materials, methods, and machinery that are conventional at the time of filing the present application are encompassed by this description. Also encompassed are materials, methods, and machinery that are not presently conventional, but that will have become recognized in the art as suitable for a similar purpose.

Unless stated otherwise, all percentages, parts, ratios, and like amounts, are defined by weight.

As used herein, the term "copolymer" refers to polymers comprising copolymerized units resulting from copolymerization of two or more comonomers. In this connection, a copolymer may be described herein with reference to its constituent comonomers or to the amounts of its constituent comonomers, for example "a copolymer comprising ethylene and 18 weight % of acrylic acid", or a similar description. Such a description may be considered informal in that it does not refer to the comonomers as copolymerized units; in that it does not include a conventional nomenclature for the copolymer, for example International Union of Pure and Applied Chemistry (IUPAC) nomenclature; in that it does not use product-by-process terminology; or for another reason. As used herein, however, a description of a copolymer with reference to its constituent comonomers or to the amounts of its constituent comonomers means that the copolymer contains copolymerized units (in the specified amounts when specified) of the specified comonomers. It follows as a corollary that a copolymer is not the product of a reaction mixture containing given comonomers in given amounts, unless expressly stated in limited circumstances to be such. The term "copolymer" may refer to polymers that consist essentially of copolymerized units of two different monomers (a dipolymer), or that consist essentially of more than two different monomers (a terpolymer consisting essentially of three different comonomers, a tetrapolymer consisting essentially of four different comonomers, etc.).

The terms "epoxy group", "ethylene oxide group" and "oxirane ring" are synonymous and used interchangeably herein to refer to a substituted or unsubstituted group having the formula —CROCR$_2$, wherein the oxygen atom is bound to both carbons and the carbons are bound to each other. When the R groups are hydrogen atoms, the ethylene oxide group is unsubstituted. The ethylene oxide group may be singly or multiply substituted with groups independently selected from hydrogen and other atoms or groups. Stated alternatively, one, two or three of the R groups may be other than hydrogen atoms.

The term "alkyl group", as used herein alone or in combined form, such as, for example, "alkoxy group", refers to saturated hydrocarbon groups that have from 1 to 8 carbon atoms having one substituent and that may be branched or unbranched. The term "alkylene" refers to a saturated hydrocarbon having two substituents, such as methylene, ethylene or propylene.

In this application, the terms "sheet", "layer" and "film" are used in their broad sense interchangeably. A "frontsheet" is a sheet, layer or film positioned as the outermost layer on the side of a photovoltaic module that faces a light source. It may also be described as an incident layer. Because of its location, it is generally desirable that the frontsheet have high transparency to the desired frequency of incident light. It is also desirable that the frontsheet have high moisture barrier properties to prevent entry of moisture into the photovoltaic module, which can degrade the components and/or reduce the electrical efficiency of the photovoltaic module. A "backsheet" is a sheet, layer or film on the side of a photovoltaic module that faces away from a light source, and is often opaque. In some instances, it may be desirable to receive light from both sides of a device (e.g. a bifacial device), in which case a module may have transparent layers on both sides of the device.

"Encapsulant" layers are used to encase the fragile voltage-generating solar cell layer to protect it from damage and hold it in place in the photovoltaic module. Encapsulant layers are normally positioned between the solar cell layer and the incident layer, or between the solar cell layer and the backing layer. Suitable polymer materials for these encapsulant layers typically possess a combination of characteristics such as high transparency, high impact resistance, high penetration resistance, high moisture resistance, good ultraviolet (UV) light resistance, good long term thermal stability, adequate adhesion strength to frontsheets, backsheets, other rigid polymeric sheets and cell surfaces, and good long term weatherability.

An "integrated frontsheet" is a sheet, layer or film that combines an incident layer and an encapsulant layer. An "integrated backsheet" is a sheet, layer or film that combines a backing layer and an encapsulant layer.

A "laminate" is a structure that can be constructed by uniting two or more layers of materials together, optionally using heat, vacuum or positive pressure.

The terms "transparency" and "transparent" as used herein refer to the amount of light that can pass through or be transmitted through a material, compared to the light transmitted through air. "Light transmission level" as used herein is the percentage of light transmitted through a material compared to that transmitted through air.

Finally, the term "solar cell" as used herein includes any article which can convert light into electrical energy. Solar cells useful in the invention include, but are not limited to, wafer-based solar cells (e.g., c-Si or mc-Si based solar cells), thin film solar cells (e.g., a-Si, μc-Si, CdTe, or CI(G)S based solar cells), and organic solar cells.

Increased light transmission for front sheet constructions is desirable for increasing the amount of incident sunlight that reaches the solar cell layer. This enables improved efficiency of photovoltaic modules by allowing more solar energy to be available for conversion to electrical energy by the solar cells.

Good adhesion between the layers of a multilayer front sheet aids in ensuring optimal light transmission. Organosilane coupling agents have been used in the past to improve adhesion between compositions used as encapsulant materials and various materials used in incident layers of photovoltaic modules. For example, ethylene/vinyl acetate (EVA) copolymer compositions used in photovoltaic module encapsulant layers generally include an organosilane coupling agent such as y-methacryloxy-propyltrimethoxysilane to facilitate bonding to other materials. See "Adhesion Strength Study of EVA Encapsulants on Glass Substrates" F. J. Pern and S. H. Glick, NCPV and Solar Program Review Meeting 2003 NREL/CD-520-33586, Page 942.

It has now been found that certain ethylene copolymer blends as described herein provide compositions that exhibit adhesion to fluorinated copolymer resin films that is significantly enhanced compared to that of similar compositions comprising other polymeric materials. The enhanced adhesion is attained without the necessity of modification of the blends with silane coupling agents. Significantly enhanced adhesion is observed after exposure to damp heat (85° C./85% relative humidity) for periods of 1000 hours or more as described in the test methods set forth below.

In addition, the ethylene copolymer blends have the advantage of higher melting points than EVA compositions previously used in photovoltaic modules.

It has further been found that the ethylene copolymer blends described herein can be used to prepare a transparent laminate having unusually good adhesion properties. The laminate comprises a film layer that consists essentially of a fluorinated copolymer resin directly adhered to a second film layer that consists essentially of the ethylene copolymer blend. The laminate of fluorinated copolymer resin film and adhered ethylene copolymer blend film has substantially enhanced interlayer adhesion properties compared to similar laminates that do not comprise the ethylene copolymer blend film layer. The compositions described herein provide a weatherable multilayer film laminate that has an unusual combination of high adhesivity and excellent transparency, and which is particularly suited for use in photovoltaic modules. As used herein, the term "weatherable multilayer film" refers to a film in which the individual layers are well adhered to each other, such that the peel strength between the layers is greater than 5 lbf/in after exposure to 1000 hours of damp heat (85° C./85% relative humidity), as described in the test methods set forth below.

The first layer of the multilayer film laminate of the invention comprises a fluorinated copolymer resin. Suitable fluorinated copolymer resin components of the first layer are tetrafluoroethylene (TFE) copolymers. That is, the polymer component will contain copolymerized units of tetrafluoroethylene and additional copolymerized monomers. These fluoropolymers are used to form transparent films having excellent moisture barrier properties and transparency.

The basic and novel characteristics of the multilayer laminate include transparency and interlayer adhesivity, more fully described hereinbelow. In addition, if non-fluorinated monomers are present as copolymerized units, the amount of such monomers should be limited so that the copolymer retains desirable fluoropolymer properties, i.e., weather resistance, solvent resistance and barrier properties. In certain embodiments, the fluorinated copolymer resin is a copolymer of fluoroolefins and fluorinated vinyl ethers. Atoms other than fluorine and carbon may be present in the copolymer end groups, i.e., the groups that terminate the polymer chains.

The fluoropolymers, including perfluoropolymers, used herein are those that are melt-fabricable, i.e., they are sufficiently flowable in the molten state that they can be fabricated by melt processing, for example by extrusion, to produce products having sufficient strength so as to be useful. The melt flow rate (MFR) of the fluoropolymers is preferably at least about 5 g/10 min, more preferably at least about 10 g/10 min, still more preferably at least about 15 g/10 min, even more preferably at least about 20 g/10 min, and most preferably, at least about 26 g/10 min, as measured according to ASTM D 1238 at the temperature and load which are standard for the resin (see for example ASTM D 2116-91a and ASTM D 3307-93).

Fluoropolymers of note include ethylene-tetrafluoroethylene copolymers (ETFE). Commercial ETFE copolymers are typically ethylene-tetrafluoroethylene copolymers modified by incorporation of a small amount of an additional termonomer. Modified ETFE comprises from about 35 to about 65 mole percent ethylene, about 35 to about 65 mole percent tetrafluoroethylene, and a small amount of a copolymerizable vinyl monomer which is free of telogenic activity and which incorporates into the copolymer a side chain containing at least two carbon atoms, with the side chain having only single bonds between elements or comprising an aromatic ring. In this context, the term "small amount" refers to up to about 5 mole percent, based on the total number of moles of copolymerized residues in the ETFE copolymer. Preferably, the ratio of ethylene to TFE in the copolymer is about 40:60 to 60:40 or about 50:50. The incorporation of a small amount of termonomer provides significantly improved tensile strength, stiffness, flex life, impact strength, abrasion resistance and cut-through resistance over the unmodified copolymer.

Such modified ETFE copolymers are taught in U.S. Pat. No. 3,624,250, and specifications for the copolymer and test methods for the as-produced copolymer are found in ASTM method D3159.

Of note are ETFE copolymers that incorporate perfluorobutyl-ethylene (3,3,4,4,5,5,6,6,6-nonafluorohexa-1-ene or PFBE) as a termonomer, including copolymers that contain 70 to 85 weight % TFE, 15 to 20 weight % ethylene and 2 to 5 weight % PFBE. Examples of such copolymers are those that contain 76.5 to 80.1 weight % TFE, 17.8 to 19.6 weight % ethylene, and 2.1 to 3.9 weight % PFBE.

Suitable ETFE copolymers are also described in the Kirk-Othmer Encyclopedia of Chemical Technology (5th edition), 2006, volume 18, pages 316-329.

Alternatives to ETFE films that exhibit higher transparency and/or better barrier properties are desirable, particularly for use in flexible solar cell modules where the use of rigid glass is not feasible. One such alternative is a film made from a perfluorinated copolymer resin such as tetrafluoroethylene-hexafluoropropylene copolymer (FEP). Adhesion of perfluorinated copolymers such as FEP to common encapsulant materials can be significantly poorer than adhesion of ETFE to such materials, however. Nevertheless, the ethylene ester terpolymers described herein provide excellent adhesion to FEP, even without modification by organosilanes.

The fluoropolymers used in the laminates and methods described herein include perfluoropolymers. As indicated by the prefix "per", in perfluoropolymers the monovalent atoms bonded to the carbon atoms making up the polymer chain are all fluorine atoms.

If nonfluorinated monomers are used as comonomers, the amount that is copolymerized should be limited so that the copolymer retains the desirable properties of the perfluoropolymer, i.e., weather resistance, solvent resistance, barrier properties, etc. In one embodiment, fluorinated comonomers include fluoroolefins and fluorinated vinyl ethers. Other atoms may be present in the polymer end groups, i.e. the groups that terminate the polymer chain.

Examples of suitable perfluoropolymers include copolymers of tetrafluoroethylene (TFE) with one or more perfluorinated polymerizable comonomers, including a perfluoroolefin having 3 to 8 carbon atoms, such as hexafluoropropylene (HFP), or perfluoro(alkyl vinyl ether) (PAVE) in which the linear or branched alkyl group contains 1 to 5 carbon atoms. Preferred PAVE monomers are those in which the alkyl group contains 1, 2, 3 or 4 carbon atoms, respectively known as perfluoro(methyl vinyl ether) (PMVE), perfluoro(ethyl vinyl ether) (PEVE), perfluoro(propyl vinyl ether) (PPVE), and perfluoro(butyl vinyl ether) (PBVE). The copolymer can be made using several PAVE monomers, such as the TFE/perfluoro(methyl vinyl ether)/perfluoro(propyl vinyl ether) copolymer, sometimes called MFA by the manufacturer. The TFE/PAVE copolymers are most commonly referred to as PFA. When the PAVE is PPVE or PEVE, the PFA copolymer typically includes at least about 1 weight % PAVE, based on the total weight of the perfluoropolymer, and will typically contain about 1 to 15 weight % PAVE. When the PAVE includes PMVE, the PFA copolymer typically contains about 0.5 to 13 weight % of perfluoro (methyl vinyl ether) and about 0.5 to 3 weight % of PPVE, the remainder, which brings the total to 100 weight %, being TFE.

Tetrafluorethylene-hexafluoropropylene copolymers are preferred perfluoropolymers. These copolymers are commonly referred to as fluorinated ethylene propylene (FEP) polymers. The term "FEP copolymers" refers to copolymerized comonomers of tetrafluoroethylene (TFE) and hexafluoropropylene (HFP), optionally with any number of other copolymerized monomer units. The FEP copolymers may thus be dipolymers, terpolymers, tetrapolymers, and higher order copolymers.

In these copolymers, the HFP content is typically about 6-17 weight %, preferably 9-17 weight %. The empirical formula, including the HFPI (HFP Index) is calculated from the ratio of infrared radiation (IR) absorbances at specified IR wavelengths, as described in U.S. Statutory Invention Registration H130. Preferably, the TFE/HFP copolymer includes a small amount of additional comonomer to enhance certain physical properties. The FEP copolymer can be TFE/HFP/perfluoro(alkyl vinyl ether) (PAVE), wherein the alkyl group contains 1 to 4 carbon atoms such as PEVE or PPVE. A preferred TFE/HFP copolymer is TFE/HFP/PAVE, such as PEVE or PPVE, wherein the HFP content is about 6 to 17 weight %, preferably 9 to 17 weight %, and the PAVE content, preferably PEVE, is about 0.2 to 3 weight %, the remainder being TFE, thereby bringing the total weight percentage to 100 weight % of the copolymer.

Examples of useful FEP compositions are those described in U.S. Pat. Nos. 4,029,868; 5,677,404; and 6,541,588; U.S. Patent Application Publication 2007/292685 and in US Statutory Invention Registration H130. The FEP may be partially crystalline. That is, it is not an elastomer. "Partially crystalline" polymers have some crystallinity and are characterized by a detectable melting point, measured according to ASTM D 3418, and a melting endotherm of at least about 3 J/g.

Of note are terpolymers containing copolymerized units of HFP (about 6 to 10 weight %) and less than 2 weight % of perfluoroethylvinyl-ether PEVE (about 1.5 to 2 weight %), with the remainder of the copolymerized units being TFE units. For example, such a copolymer may contain 7.2 to 8.1 weight % HFP, 1.5 to 1.8 weight % PEVE and 90.1 to 91.3 weight % TFE, with a nominal melt flow rate (MFR) of 6 to 8 gm/10 min as defined in ASTM D 2116 and a melting point of 260° C. to 270° C.

The first film layer of the multilayer film laminate of the invention comprises the above-described fluorinated copolymer resin. It may also comprise other components that do not adversely affect transparency and adhesion of the copolymer resin. For example, additives such as processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), dispersants, surfactants, chelating agents, coupling agents, reinforcement additives (e.g., glass fiber), and fillers may be present in the first layer. Generally, such additives are present in amounts of up to 20 weight percent of the first film layer composition, based on the weight of the total composition of the first layer. In many embodiments, no more than 10 weight percent of additives are present. In other embodiments less than 2 weight percent of additives are present.

Transparent fluorinated copolymer film layers suitable for use in the film laminates of the invention may be formed by any suitable technique known to those skilled in the art. For example, the films may be extrusion cast and optionally stretched and heat stabilized. Desirably, perfluorinated copolymer resin films used in the invention are oriented to provide improved properties, such as improved toughness and tensile strength.

The transparent fluorinated copolymer resin film may have a thickness in the range of about 25 to 200 microns, or about 50 to 150 microns, or about 50 to 125 microns. It may have a transmission of greater than about 90%, or greater than about 94%, or greater than about 97%, for light in the visible region of the electromagnetic spectrum, which has a wavelength of from 380 to 780 nm. Similarly high transmission may also be observed for light in other regions of the electromagnetic spectrum, such as light having a wavelength of from 350 to 380 nm, or from 780 to 800 nm or higher.

The transparent fluorinated copolymer resin film of the first film layer is subjected to a surface treatment prior to lamination to the second film layer. The surface treatment may be applied to the surfaces of one or both sides of the fluoropolymer film. This surface treatment modifies the surface of the film and may take any form known in the art, including flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, chemical treatments, chromic acid treatments, hot air treatments, ozone treatments, ultraviolet light treatments, sand blast treatments, solvent treatments, and combinations of two or more of these treatments. A notable surface treatment is corona treatment (see, e.g., U.S. Pat. Nos. 3,030,290; 3,676,181; 6,726,979 and 6,972,068). Corona treatment may include the use of reactive hydrocarbon vapors such as ketones, e.g., acetone, alcohols, p-chlorostyrene, acrylonitrile, propylene diamine, anhydrous ammonia, styrene sulfonic acid, carbon tetrachloride, tetraethylene pentamine, cyclohexylamine, tetraisopropyl titanate, decylamine, tetrahydrofuran, diethylene triamine, tertiary-butylamine, ethylene diamine, toluene-2,4-diisocyanate, glycidyl methacrylate, triethylene tetramine, hexane, triethylamine, methyl alcohol, vinyl acetate, methyl isopropyl amine, vinyl butyl ether, methyl methacrylate, 2-vinyl pyrrolidone, methyl vinyl ketone, xylene or mixtures of two or more of these hydrocarbons.

When the fluorinated copolymer resin film is surface-treated, the resulting chemical or physical modification of the fluorinated copolymer resin or of the film surface provides a modified first film layer surface. The modified fluorinated copolymer surface makes it more amenable to further treatment, such as improved adhesion to other materials. Without being tied to any specific mechanism or theory, the surface treatment may create polar functionalization or increase the surface energy of the surface.

FEP films that have been surface-treated, as described above, are suitable for use in this invention. One example, Teflon® FEP of the grade designated PV3151, is commercially available from E. I. du Pont de Nemours and Company ("DuPont").

Notably, a fluorinated copolymer resin film that has been subjected to a corona treatment may also be surface-treated with an organosilane coupling agent prior to contacting the surface of the second layer. The organosilane coupling agent may be applied to the surface of one side of the fluorinated copolymer resin film, for example the treated side, or it may be applied to the surfaces of both sides of the fluorinated copolymer resin film.

An organosilane coupling agent is a silane coupling agent that contains at least one carbon-silicon bond. The silicon atom may be bonded to one, two or three hydrolysable groups, such as methoxy, ethoxy, chloro, or acetoxy groups. In addition, the organosilane compound preferably includes an organoreactive group. Without being bound by any theory, the silane may bond to reactive moieties on the surface of the fluoropolymer via the hydrolysable group(s) and then may either react with or physically entangle with a polymer or other organic material via the organoreactive group.

Organosilane coupling agents can contain a wide variety of organoreactive groups. Some examples of different types of organoreactive groups may include amino, benzylamino, methacrylate, vinylbenzylamino, epoxy, chloropropyl, melamine, vinyl, ureido, mercapto, disulfide, and tetrasulfido groups. An organosilane coupling agent may include a single type of organoreactive group, a mixture of two or more groups of the same type, a mixture of two or more different types of groups, or a combination thereof. An example of a suitable silane coupling agent is [3-(methacryloyloxy)propyl]trimethoxysilane (MAOPTMS or 3-(trimethoxysilyl)propyl methacrylate).

Preferably, the organosilane that is used to treat the fluorinated copolymer resin film is an aminosilane coupling agent. Examples of useful aminosilanes include 3-aminopropyltrimethoxysilane (APTMS), 3-aminopropyltriethoxysilane (APTES), N,N'-bis[(3-trimethoxysilyl)-propyl]ethylenediamine (dipodalAP), N-(2-aminoethyl)-3-aminopropyltrimethoxysilane (AEAPTMS) and N2-(vinylbenzylamino)-ethyl-aminopropyltrimethoxysilane (SMAEAPTMS), notably APTMS, APTES and AEAPTMS.

The organosilane coupling agent may be applied to the treated or untreated surface of the fluorinated copolymer resin film layer using any suitable technique, including liquid phase (e.g., dip coating, spray coating, etc.) and gas phase (e.g., vapor deposition) techniques. Preferably, the aminosilane coupling agent is applied as a liquid solution, generally a solution in which the concentration of aminosilane is from 0.05 to 1% by weight. The aminosilane may be dissolved in a solution including a polar organic solvent and applied to a film using a dip coating technique, followed by drying to remove the solvent. The drying may occur at an elevated temperature, sufficient to drive off the liquid solvent. The polar organic solvent may be a low molecular weight alcohol, such as those having 8 or fewer, preferably 4 or fewer, carbon atoms, (e.g., methanol, ethanol, propanol, or isopropanol). The solution may include a mixture of a polar organic solvent and water. For example, a 0.1 weight % aminosilane solution in 95% aqueous ethanol may be applied to a treated fluoropolymer film, which is then dried at a temperature of 100° C. A range of solution compositions and drying temperatures may be used. The particular drying conditions can be selected by those of skill in the art based on the identity of the aminosilane and its solvent. The particular solution composition can be selected by those of skill in the art based on the identity of the aminosilane and its solvent, and also based on the surface characteristics of the fluorinated copolymer resin film layer and the second ethylene terpolymer film layer to which it will be adhered.

Silane surface treatment of the fluorinated copolymer resin film layer may be used to enhance adhesion of the fluorinated copolymer resin to the second film layer. Notably, however, the ethylene copolymer blends described herein for use in the second film layer have good adhesion to fluorinated copolymer resin film layers without silane surface treatment of the fluorinated copolymer resin film layer.

The second film layer consists essentially of the ethylene copolymer blend and is substantially free of polymers other than the ethylene copolymers in the blend. Because the transparent multilayer film laminate is suitable for use as an integrated front sheet for a photovoltaic module, the second film layer is preferably able to function as an encapsulant layer. Alternatively, the second film layer may be used as an adhesive layer, providing excellent adhesion to both fluorinated copolymer resins and to other materials that can be used as encapsulant materials in photovoltaic modules.

The ethylene copolymer blend contains Ethylene Copolymer 1 and Ethylene Copolymer 2, or the product of crosslinking Ethylene Copolymers 1 and 2, in which some acid groups of the second olefin have reacted with some epoxy groups of the third olefin. Ethylene Copolymers 1 and 2 and the crosslinking reaction between them are described in detail in U.S. Patent Appln. Publn. No. 2011/0023943 by George W. Prejean (hereinafter "Prejean").

Briefly, however, Ethylene Copolymer 1 consists essentially of copolymerized units of ethylene; optionally copolymerized units of a first olefin having a formula of $CH_2=C(R^1)CO_2R^2$; and copolymerized units of a second olefin having a formula of $CH_2=C(R^3)COOH$. Ethylene Copolymer 2 consists essentially of copolymerized units of ethylene; optionally copolymerized units of the first olefin; and copolymerized units of a third olefin having a formula of $CH_2=C(R^3)D$. In these formulae, $R^1$ represents hydrogen or an alkyl group; $R^2$ represents an alkyl group; $R^3$ represents hydrogen or an alkyl group; and D represents a moiety selected from the group consisting of $-CO_2R^4$, $-CO_2R^5-R^4$, $-R^5-R^4$, $-O-R^4$, and $-R^4$, wherein $R^4$ represents a moiety containing an epoxy group and $R^5$ represents an alkylene group.

Examples of α,β-ethylenically unsaturated carboxylic acid esters that are suitable first olefin comonomers are set forth in Prejean. Preferably, the esters of unsaturated carboxylic acids are alkyl acrylates or alkyl methacrylates. More preferably, Ethylene Copolymer 1 comprises copolymerized units of an alkyl acrylate. The alkyl moiety of the alkyl acrylate may contain 1 to 8 or 1 to 4 carbon atoms. Examples of suitable alkyl (meth)acrylates include, but are not limited to, methyl (meth)acrylate, ethyl (meth)acrylate, iso-butyl (meth)acrylate, and n-butyl (meth)acrylate. These terpolymers may contain up to 40 weight %, or 10 to 40 weight %, or preferably 20 to 35 weight % of alkyl acrylate or alkyl methacrylate, based on the total weight of the terpolymer. Notable terpolymers comprise copolymerized units of n-butyl acrylate, for example 20 to 30 weight % of n-butyl acrylate.

Suitable α,β-ethylenically unsaturated carboxylic acid comonomers for use as the second olefin include, but are not limited to, acrylic acids, methacrylic acids, and combinations thereof. Preferably, the α,β-ethylenically unsaturated carboxylic acid is selected from the group consisting of acrylic acids, methacrylic acids, and combinations of two or more acrylic acids and methacrylic acids. Ethylene Copolymer 1 may contain up to 30 weight %, or about 2 to about 30 weight %, or about 5 to about 20 weight %, or about 5 to about 15 weight %, based on the total weight of the copolymer, of copolymerized residues of the α,β-unsaturated carboxylic acid.

The remainder of Ethylene Copolymer 1 comprises copolymerized residues of ethylene. In addition, however, Ethylene Copolymer 1 may optionally further comprise other suitable additional comonomers, such as unsaturated carboxylic acids having 2 to 10, or preferably 3 to 8 carbons, or derivatives thereof. Suitable acid derivatives include acid anhydrides, amides, and esters. Esters are preferred. Specific examples of preferred esters of unsaturated carboxylic acids are set forth in Prejean. Examples of preferred comonomers include, but are not limited to, methyl (meth)acrylates, butyl (meth)acrylates, vinyl acetates, and combinations of two or more thereof.

Neither the first olefin nor the second olefin nor the other suitable additional comonomer, however, is a dicarboxylic acid or a diester, monoester or anhydride of a dicarboxylic acid. Dicarboxylic acids include maleic acid, fumaric acid, itaconic acid, citraconic acid, mesaconic acid, and the like. In addition, Ethylene Copolymer 1 preferably does not incorporate other comonomers in any significant amount. Stated alternatively, it is preferable that Ethylene Copolymer 1 consist essentially of copolymerized residues of ethylene and the second olefin, or that Ethylene Copolymer 1 consist essentially of copolymerized residues of ethylene, the optional first olefin and the second olefin.

Copolymerization of ethylene, the first olefin and the second olefin provides an ethylene ester acid terpolymer. Methods of preparing ethylene ester acid terpolymers are known. For example, the terpolymers may be prepared in continuous polymerizers by use of "co-solvent technology" as described in U.S. Pat. No. 5,028,674.

Significantly, the ethylene ester acid terpolymer is not an ionomer; that is, its carboxylate groups are not deprotonated, or not deprotonated to a significant extent. In a particular example, it is a copolymer of ethylene/n-butyl acrylate/acrylic acid. Preferably, the first olefin comonomer, i.e. the monomer of the formula $CH_2=C(R^1)CO_2R^2$, is butyl acrylate.

Ethylene Copolymer 1 may have a melt flow rate or melt index (MFR or MI) of about 5 g/10 min or higher, about 10 g/10 min or higher, or about 30 to about 1000 g/10 min, or about 60 g/10 min or higher, or about 100 to about 500 g/10 min, as determined in accordance with ASTM D1238 at 190° C. and under a weight of 2.16 kg.

Ethylene ester acid terpolymers are commercially available from DuPont under the trademark Nucrel®.

Ethylene Copolymer 2 is a copolymer comprising copolymerized units of ethylene, optionally of the first olefin of the formula $CH_2=C(R^1)CO_2R^2$, and of a third olefin of the formula $CH_2=C(R^4)D$, wherein $R^4$ is hydrogen or an alkyl group; D is selected $-CO_2R^5$, $-CO_2R^6-R^5$, $-R^6-R^5$, $-O-R^5$, $-R^5$; and wherein $R^6$ is an alkylene group and $R^5$ is a moiety containing an epoxy group, such as a glycidyl group, a 1,2-cyclohexenyl oxide group, or a 1,2-epoxy group. Like the first and the second olefins and the optional additional comonomers, the third olefin is also not a dicarboxylic acid or a di-ester, mono-ester or anhydride of a dicarboxylic acid.

In addition, the Ethylene Copolymer 2 may optionally further comprise other suitable additional comonomers, as described above with respect to Ethylene Copolymer 1. Preferably, however, Ethylene Copolymer 2 preferably does not contain other comonomers in any significant amount. Stated alternatively, it is preferable that Ethylene Copolymer 2 consist essentially of copolymerized residues of ethylene and the third olefin, or that Ethylene Copolymer 2 consist essentially of copolymerized residues of ethylene, the optional first olefin and the third olefin Whether the first olefin is present in Ethylene Copolymer 2 is independent of whether it is also present in Ethylene Copolymer 1, and vice versa. Moreover, when the first olefin is present in both of Ethylene Copolymers 1 and 2, the olefin itself may be the same or different in each of the copolymers. For example, Ethylene Copolymer 1 may be a copolymer of ethylene/n-butyl acrylate/acrylic acid and Ethylene Copolymer 2 may be a copolymer of ethylene/n-butyl acrylate/glycidyl methacrylate. Alternatively, Ethylene Copolymer 1 may be a copolymer of ethylene/methyl acrylate/acrylic acid and Ethylene Copolymer 2 may be a copolymer of ethylene/ethyl acrylate/glycidyl methacrylate.

Ethylene Copolymer 2 may contain about 3 to about 15 weight % or about 3 to about 10 weight %, or about 4 to about 7 weight %, based on the total weight of the copolymer, of copolymerized residues of the third olefin. Ethylene Copolymer 2 also contains up to 40 weight %, or 15 to 40 weight %, preferably 20 to 35 weight % of copolymerized units of the first olefin, if present, the remainder being copolymerized units of ethylene and up to 5 weight % of copolymerized units of the optional additional comonomer, if present.

Preferably, in Ethylene Copolymer 2, the first olefin comonomer $CH_2=C(R^1)CO_2R^2$ is butyl acrylate and D in the formula $CH_2=C(R^3)D$ is $-CO_2R^4$, $-CO_2R^5-R^4$, $-R^5-R^4$, $-O-R^4$, or $-R^4$. In one particular example, Ethylene Copolymer 2 is the copolymer ethylene/n-butyl acrylate/glycidyl methacrylate. Such terpolymers are commercially available from DuPont under the trademark Elvaloy®.

In addition, Ethylene Copolymer 2 has a melt flow rate of about 5 to about 300 or about 5 to about 100 g/10 min, as determined in accordance with ASTM D1238 at 190° C. and under a weight of 2.16 kg.

The ratio of the Ethylene Copolymer 1 and the Ethylene Copolymer 2 in the blend composition ranges from about 90:10 to about 10:90, or about 80:20 to about 20:80, or about 70:30 to about 30:70, or about 60:40 to about 40:60, or about 45:55 to 55:45, or the ratio is about 50:50 by weight based on the total weight of Ethylene Copolymer 1 and Ethylene Copolymer 2 in the blend composition.

The mole ratio of carboxylic acid and carboxylate groups in Ethylene Copolymer 1 to epoxy groups in Ethylene Copolymer 2 is preferably about 10:1 to 1:10, about 5:1 to 1:5, about 3:1 to 1:3, or about 2 to 1.

The blend composition of Ethylene Copolymer 1 and Ethylene Copolymer 2 can be prepared by any suitable process, such as melt blending, compounding, and extrusion to pelletized blend. Preferably, no water, no other solvents such as organic solvents and aromatic solvents, and no plasticizers are added to the Ethylene Copolymer 1 and Ethylene Copolymer 2 during the blending process. Stated alternatively, in a preferred process, neat Ethylene Copolymer 1 is combined with neat Ethylene Copolymer 2 in a melt process to form a neat blend composition. At no time during the preferred process do Ethylene Copolymers 1 and 2 include more than adventitious amounts of water, other solvent, or plasticizer.

During the blending and extruding processes, the temperature of the blend is preferably maintained at or below about 135° C., to prevent premature cross-linking. More preferably, the temperature of the blend is maintained at or below about 130° C., 125° C. or 120° C. At temperatures of about 120° C. or higher, the carboxylate group in Ethylene Copolymer 1 reacts with the epoxy group in Ethylene Copolymer 2 to form a blend composition that is cross-linked. Without wishing to be bound by theory, it is believed that the cross-linking reaction between an ionomer comprising acrylic acid residues and a copolymer comprising residues of glycidyl methacrylate operates by a mechanism in which a carboxylic acid group of the ionomer reacts to open an epoxide ring to form an hydryoxyalkyl ester linkage.

Those of skill in the art are aware that the cross-linking reaction may well proceed at temperatures that are below 135° C., or below 120° C. The kinetics of the reaction, however, are such that the blend composition may be held at 135° C. or less for a significant amount of time (up to about 15 minutes) without cross-linking to the extent that the blend composition becomes intractable for further processing.

In addition, those of skill in the art are able to determine an appropriate level of cross-linking based on the physical properties that are desired in the cross-linked encapsulant layer. Those of skill in the art are also aware that the time required to obtain a desired level of cross-linking depends directly on the concentration of carboxylic acid groups and epoxy groups. Likewise, the time required to obtain a desired level of cross-linking depends inversely on the temperature at which the cross-linking reaction is carried out, and also depends inversely or in another negative logarithmic relationship on the melt index of the polymer blend. Finally, although the discussion above indicates that the cross-linking reaction requires heat, the reaction may be also carried out using catalysis, or by using a combination of heat and catalysis. A discussion of suitable catalysts and techniques is set forth in Prejean. In addition, one preferred catalyst is 2-ethyl imidazole. A preferred amount of 2-ethyl imidazole is 200 to 1500 ppm, based on the total amount of the ethylene copolymer blend.

The composition used in the second film layer may further contain one or more non-polymeric additives, such as plasticizers, processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), dispersants, surfactants, chelating agents, coupling agents, reinforcement additives (e.g., glass fiber), and fillers.

The second layer of the multilayer laminate may be adhered to the modified surface of the fluorinated copolymer resin first film as a coating (via extrusion coating or other appropriate application methods), as a film or membrane, or as a layer of a laminate.

Extrusion coating involves melting the blend composition in an extruder and passing it through a slit die to form a molten polymer curtain which drops onto a moving film substrate comprising the first layer fluoropolymer composition. The blend coating is adhered by being pressed onto the substrate and quenched by a quench drum.

Alternatively, the first and second film layers may be adhered in a lamination process. For example, a surface of the first fluorinated copolymer resin layer that has been surface-modified as described above is contacted with a surface of a film of the second film layer blend composition. Contact is made in such a manner that the fluorinated copolymer resin layer and the second film layer are arranged in overlying fashion. The two layers in the resulting multilayer overlay or "pre-laminate assembly" may be adhered by the application of heat and optionally pressure or vacuum to provide the transparent multilayer film laminate described herein.

Sufficient heat is applied to the multilayer overlay to reach a temperature above the softening temperature of the second film layer so that it softens and adheres to the first fluorinated copolymer resin layer. In addition, one or more other layers may be in contact with one or more of the first and/or second film layers. No layers intervene between the first and second film layers, however. Depending on the equipment used, lamination conditions, number of other layers present, and the like, it may be necessary to maintain the temperature at 10 to 30° C. higher than the softening temperature of the second film layer for a period of one to 10 minutes, or one to 30 minutes, to achieve adhesion and cross-linking, if desired. Optionally, pressure or vacuum can be applied to the multilayer film structure during heating to ensure good contact between the layers. This process provides a multilayer film laminate that exhibits excellent adhesion properties. Preferably, the laminate is formed at a temperature that is sufficiently high to crosslink Ethylene Copolymers 1 and 2. Also preferably, the laminate is held at temperature for a length of time that is sufficient to crosslink Ethylene Copolymers 1 and 2. A suitable period of time is estimated as up to 30 minutes in an autoclave or up to 20 minutes in a laminator.

In some embodiments, it may be desirable to effect adhesion by contacting the second film layer with the first fluorinated copolymer resin film layer to form a multilayer film overlay, applying heat and passing the multilayer film structure through a nip. Suitable conditions for a nip roll process are set forth in Prejean. The multilayer film laminates described herein may also be produced through non-autoclave processes. Such non-autoclave processes are described, for example, in U.S. Pat. Nos. 3,234,062; 3,852,136; 4,341,576; 4,385,951; 4,398,979; 5,536,347; 5,853,516; 6,342,116 and 5,415,909; in U.S. Patent Appln. Publn. No. 20040182493; In European Patent No. EP1235683 B1; and in Intl. Patent Appln. Publn. Nos. WO9101880 and WO03057478. Generally, the non-autoclave processes include heating the pre-lamination assembly and the application of vacuum, pressure or both. For example, the assembly may be successively passed through heating ovens and nip rolls.

Alternatively, a vacuum laminator may be used to adhere the fluorinated copolymer resin first film layer to the second film layer to provide a multilayer film laminate. Examples of suitable vacuum laminators and processes employing vacuum laminators are set forth in U.S. Patent Appln. Publn. No. 2011/0297314, by Sam L. Samuels (hereinafter "Samuels").

With appropriate modifications, the lamination procedure can also be used to prepare photovoltaic modules including encapsulant layers, solar cell layers and/or backing layers as described below. Other lamination methodologies may also be suitable. For example, more advanced laminators have retractable pins that hold the multilayer laminate structure above the heat source until the desired time to effect contact and heating. This would obviate the need for heat resistant layers in most cases.

The weatherable multilayer film laminate may be used as an integrated frontsheet for a photovoltaic module. Integrated frontsheets provide all the properties necessary to protect the electrical components of a photovoltaic module provided by separate incident and encapsulant layers and can be attached directly to the solar cell layer of the module. In the transparent multilayer film laminate described herein, the fluorinated copolymer resin film layer functions as the incident layer and the second film layer functions as an encapsulant layer.

Further provided herein is a method for forming a photovoltaic module that comprises the above-described method for preparing a transparent multilayer film laminate and also further comprises a step of overlaying a solar cell layer with the transparent multilayer film laminate prepared by the process of the invention. The photovoltaic module, the solar cell layer, the encapsulant layer and the additional layer or layers used in these methods are described in greater detail below.

In one process, a solar cell layer is contacted with the transparent multilayer film laminate in such a manner that the surface of the second film layer that is opposite that which contacts the first fluorinated copolymer resin film layer will contact the solar cell layer. In this configuration, the area of the multilayer film laminate is larger than the area of the solar cell layer. Additionally, those portions of the transparent multilayer film laminate that extend beyond the perimeter of the solar cell layer are positioned so as to contact an encapsulant layer that may be the same as or different from the second film layer. The transparent multilayer film laminate is then adhered to the encapsulant layer by the application of heat and optionally pressure or vacuum to form a photovoltaic module.

The solar cell layer may be significantly thicker, with somewhat uneven surfaces with peaks and voids, than the other layers and irregular in shape, including spaces or voids between and around the solar cells and other components of the solar cell layer. Therefore, portions of the second film layer of the transparent multilayer film laminate will contact the encapsulant layer outside the perimeter of the solar cell layer and can be adhered when heat is applied. The "perimeter" of the solar cell layer is the outline of the outer limits of the area encompassed by the solar cell layer. In many cases, it is desirable that the second film layer or the encapsulant layer flow into the spaces and closely encapsulate the solar cells and other components to physically consolidate the photovoltaic module. Therefore, during the lamination process, the second film layer or the other encapsulant sheet will melt or soften to some degree, and will typically flow around the peaks and fill the voids of the solar cell assembly.

Thus, it may be necessary to apply heat for a period of time sufficient to allow such flow, which may be longer than that needed for adhering thinner layers of a more regular shape. For example, heat may be applied in such a manner that the transparent multilayer film laminate is maintained above the softening point of the second film layer thereof or above the softening point of the additional encapsulant layer, whichever is higher, for 5 to 30 minutes to effectively consolidate the photovoltaic module.

Accordingly, when the thickness of the second film layer or the additional encapsulant layer is provided herein, unless otherwise specified in limited circumstances, it is the thickness of the layer prior to lamination. In general, however, the second film layer or the encapsulant layer in the final module remains at an average total thickness of about 1 to about 120 mils (about 0.025 to about 3 mm), or about 10 to about 90 mils (about 0.25 to about 2.3 mm), or about 15 to about 60 mils (about 0.38 to about 1.5 mm), or about 15 to about 45 mils (about 0.38 to about 1.14 mm), or about 15 to about 35 mils (about 0.38 to about 0.89 mm).

The steps recited above may be accomplished using a nip roll process, a non-autoclave process, or using a vacuum laminator, as described above, with the modification that an encapsulant layer and a solar cell layer are included in a multilayer laminate structure with the transparent multilayer film structure that comprises the first perfluorinated copolymer resin film layer and the second film layer.

Another suitable process includes contacting a surface of the second film layer with a fluorinated copolymer resin film to form a film overlay structure and overlaying a solar cell layer with the film overlay structure. In this assembly, the second film layer is positioned such that portions of the second film layer extend beyond the perimeter of the solar cell layer and contact an encapsulant layer. Heat and optionally pressure or vacuum are applied to the assembly to adhere the various layers to each other simultaneously.

In the methods described above, an additional layer may also be adhered to the surface of the encapsulant layer opposite the surface that contacts portions of the surface of the second film layer. The additional layer may be adhered to the encapsulant layer prior to, simultaneously with, or subsequently to contacting and adhering the second film layer to the above-described encapsulant layer.

For example, the encapsulant layer may be part of an integrated backsheet in which the encapsulant layer is adhered to an additional layer prior to contacting and adhering to the second film layer. Alternatively, the encapsulant layer may be contacted with the second film layer of the transparent multilayer film structure on one surface and another layer, such as a backsheet, on the opposite surface and adhered to both layers simultaneously, or the encapsulant layer may be adhered to the second film layer of the transparent multilayer film structure and then adhered to another layer, such as a backsheet.

In some cases, the encapsulant layer may also be surface treated with an organosilane coupling agent such as an aminosilane to improve adhesion to the second film layer and/or the additional layer.

In any of these cases, the second film layer of the transparent multilayer film laminate may be part of an integrated frontsheet in combination with the first fluorinated copolymer resin film layer, or the first fluorinated copolymer resin film layer and second ethylene terpolymer film layer may adhered at the same time that the second ethylene terpolymer film layer of the transparent multilayer film laminate is adhered to the encapsulant layer.

The methods described above provide multilayer films and photovoltaic modules characterized by an average peel strength between the first film layer and the second film layer of greater than 5 lbf/in, or of greater than 10 lbf/in. Alternatively, when none of the layers has been treated with a silane adhesion promoter, the average peel strength between the first film layer and the second film layer may be greater than 7 lbf/in, and when one or both of the layers has been treated with a silane adhesion promoter, the average peel strength between the first film layer and the second film layer may be greater than 15 lbf/in. The peel strength is measured according to the method described in the Examples, below, after exposing the film or photovoltaic module to conditions of 85° C. and 85% relative humidity (damp heat) for 1000 hours.

In a typical photovoltaic module construction, the solar cell layer is positioned between two encapsulant layers, which are further positioned between the frontsheet (or incident layer) and backsheet layers. In the methods described herein, a layer comprising a fluorinated copolymer resin film composition of a transparent multilayer film laminate serves as the frontsheet of a photovoltaic module and the second film layer of the transparent multilayer film laminate serves as an encapsulant layer. The combination may be provided in the form of the transparent multilayer film laminate described herein, also known as an integrated front sheet. As previously described, the second film layer and an additional encapsulant layer sandwich the solar cell layer and another layer (a backsheet layer) may also be adhered to the additional encapsulant layer.

The photovoltaic modules described herein may include any type of solar cell. Preferably, the solar cell is stable in contact with the second film layer under processing and use conditions. Wafer-based and thin film solar cells are described in Prejean. Organic solar cells are described by Hoppe et al. in "Organic Solar Cells: An Overview", *J. Mater*

Res. 2004, 19(7), 1924. Within the solar cell layer, the solar cells may be electrically interconnected or arranged in a flat plane. In addition, the solar cell layer may further comprise electrical wiring, such as cross ribbons and bus bars.

The polymeric materials used in any optional additional encapsulant layer that may be present in the transparent multilayer film laminates and photovoltaic modules may be the same as, or different from, the polymeric material used in the second film layer. In addition, any optional additional encapsulant layers used in preparing transparent multilayer film and photovoltaic modules described herein may comprise a polymeric material independently selected from the group consisting of olefin unsaturated carboxylic acid copolymers, ionomers of olefin unsaturated carboxylic acid copolymers, ethylene vinyl acetate copolymers, poly(vinyl acetals) (including acoustic grade poly(vinyl acetals)), polyurethanes, polyvinylchlorides, polyethylenes (e.g., linear low density polyethylenes), polyolefin block copolymer elastomers, copolymers of $\alpha$-olefins and ethylenically unsaturated carboxylic acid esters (e.g. ethylene methyl acrylate copolymers and ethylene butyl acrylate copolymers), silicone elastomers, epoxy resins, and combinations of two or more thereof.

The optional encapsulant layer preferably comprises a thermoplastic polymer selected from the group consisting of olefin $\alpha,\beta$-unsaturated carboxylic acid copolymers, ionomers of olefin $\alpha,\beta$-unsaturated carboxylic acid copolymers, and combinations thereof. Suitable combinations include, for example, two or more olefin $\alpha,\beta$-unsaturated carboxylic acid copolymers; two or more ionomers of olefin $\alpha,\beta$ unsaturated carboxylic acid copolymers; and at least one $\alpha,\beta$-unsaturated carboxylic acid copolymer and one or more ionomers of $\alpha,\beta$-unsaturated carboxylic acid copolymers. Suitable olefin $\alpha,\beta$-unsaturated carboxylic acid copolymers and ionomers for use as additional encapsulant layers are described in detail by Samuels. Some suitable materials are also commercially available from DuPont under the trademarks Nucrel® and Surlyn®.

Also suitable for use in optional encapsulant layer are terpolymers comprising copolymerized units of ethylene; copolymerized units of a first polar comonomer selected from the group consisting of $C_1$-$C_4$ alkyl esters of butenedioic acids, such as mono and diesters of maleic acid; and copolymerized units of a second polar comononer selected from the group consisting of vinyl acetate, $C_1$-$C_4$ alkyl acrylates and $C_1$-$C_4$ alkyl methacrylates.

The composition of the encapsulant layer may comprise an ethylene/vinyl acetate copolymer comprising copolymerized units of ethylene and vinyl acetate. These copolymers may comprise 25 to 35, preferably 28 to 33, weight % of vinyl acetate. The ethylene/vinyl acetate copolymer may MFR of about 0.1 to about 1000 g/10 minutes, or about 0.3 to about 30 g/10 minutes, as determined in accordance with ASTM D 1238 at 190° C. and 2.16 kg. Suitable ethylene/vinyl acetate copolymers useful herein include those available from DuPont under the trademark Elvax®.

Alternatively, the additional encapsulant layer may comprise an olefin/alkyl acrylate copolymer comprising copolymerized units of an $\alpha$-olefin and an alkyl acrylate or an alkyl methacrylate. Suitable olefin/alkyl acrylate copolymers are described in detail by Samuels with respect to the "second film layer." Ethylene/alkyl acrylate copolymers useful herein include those available from DuPont under the trademark Elvaloy® AC.

The composition used in the encapsulant layer may further contain one or more additives, as described above with respect to the second film layer. Ethylene vinyl acetate copolymer compositions also frequently contain crosslinking agents such as organic peroxides. Any of these additives are generally present in amounts of no more than 20 weight % of the encapsulant composition, sometimes no more than 10 weight % and sometimes no more than 2 weight %.

Suitable backsheet layers may comprise polymers that include but are not limited to, polyesters (for example, poly(ethylene terephthalate) and poly(ethylene naphthalate)), polycarbonates, polyolefins (for example, polypropylene, polyethylene, and cyclic polyolefins), norbornene polymers, polystyrenes (for example, syndiotactic polystyrene), styrene-acrylate copolymers, acrylonitrile-styrene copolymers, polysulfones (for example, polyethersulfone, polysulfone, and the like), nylons, poly(urethanes), acrylics, cellulose acetates (for example, cellulose acetate, cellulose triacetates, and the like), cellophanes, silicones, poly(vinyl chlorides) (for example, poly(vinylidene chloride)), fluoropolymers (for example, polyvinyl fluoride, polyvinylidene fluoride, polytetrafluoroethylene, FEP, and ethylene-tetrafluoroethylene copolymers), and combinations of two or more thereof. The polymeric film may be non-oriented, or uniaxially oriented, or biaxially oriented. A multilayer film of polyester (PET) sandwiched between two layers of polyvinyl fluoride (PVF) is a specific example of a suitable backsheet.

Although a multilayer film comprising a fluorinated copolymer resin first film layer adhered to an ethylene terpolymer second film layer prepared as described herein has been described above as an integrated frontsheet, it may alternatively be used as an integrated backsheet. When used as an integrated backsheet, such a transparent multilayer film laminate may be used in combination with a similar or identical transparent multilayer film laminate used as an integrated frontsheet or with frontsheets and/or encapsulant layers of different compositions.

In some configurations, bifacial modules receive incident light from both sides of the device, incorporating a transparent layer on both front and back. For example, a transparent multilayer film laminate as described herein may be used as a first frontsheet of a bifacial device, while a glass layer is used as a transparent backsheet. Alternatively, in a flexible bifacial module, transparent multilayer film laminates as described herein may be used on both sides of the device, in which the compositions of each sheet may be the same or different. For example, an FEP transparent layer may be used as a frontsheet on one side of the device with an ETFE transparent layer used on the other side of the device, or FEP layers may be used on both sides of the device.

The photovoltaic module may further comprise other functional film or sheet layers (e.g., dielectric layers or barrier layers) embedded within the module. For example, poly(ethylene terephthalate) films coated with a metal oxide coating, such as those described in U.S. Pat. Nos. 6,521,825 and 6,818,819 and European Patent No. EP1182710, may function as oxygen and moisture barrier layers in the transparent multilayer film laminates or photovoltaic modules. If desired, a layer of fiber (scrim) may also be included between the solar cell layers and encapsulant layers. Scrim layers are described in, e.g., U.S. Pat. Nos. 5,583,057; 6,075,202; 6,204,443; 6,320,115; and 6,323,416 and European Patent No. EP0769818.

Finally, any of the foregoing examples of photovoltaic modules may be prepared using the methods described herein.

The following examples are provided to describe the invention in further detail. These examples, which set forth specific embodiments and a preferred mode presently contemplated for carrying out the invention, are intended to illustrate and not to limit the invention.

EXAMPLES

In the examples below, the following materials were used:

ACR-2: a terpolymer containing 28 weight % copolymerized units of n-butyl acrylate and 6.2 weight % copolymerized units of acrylic acid, the remainder copolymerized units of ethylene, with MI of 210 g/10 minute.

ACR-3: a terpolymer containing 28 weight % copolymerized units of n-butyl acrylate and 6.2 weight % copolymerized units of acrylic acid, the remainder copolymerized units of ethylene, with MI of 60 g/10 minute.

EBAGMA-1: a terpolymer containing 28 weight copolymerized units of n-butyl acrylate and 5.25 weight % copolymerized units of glycidyl methacrylate, the remainder copolymerized units of ethylene, with MI of 12 g/10 minute.

Control EVA: a urethane EVA available from Stevens Urethanes, East Hampton, Mass.

Z6040 Silane: glycidoxypropyl trimethoxysilane, available from Dow Chemical, Midland, Mich.

FEP-1: A film, corona treated on one side, comprising a tetrafluoroethylene-hexafluoropropylene copolymer (7.2 to 8.1 weight % copolymerized units HFP, 1.5 to 1.8 weight % copolymerized units PEVE and 90.1 to 91.3 weight % copolymerized units TFE), nominal melt flow rate 6 to 8 gm/10 minutes as defined in ASTM D2116 and melting between 260° C. and 270° C., designated as PV3151, available from DuPont.

ETFE-1: A film, corona treated on one side, comprising an ethylene-tetrafluoroethylene copolymer (76.5 to 80.1 weight % copolymerized units TFE, 17.8 to 19.6 weight % copolymerized units ethylene and 2.1 to 3.9 weight % copolymerized units PFBE), designated as PV3251, available from DuPont.

FEP-2: FEP-1 which has also been treated with aminopropyltrimethoxysilane.

Damp Heat Exposure

In a typical process, laminated samples were placed into a dark chamber, with the glass substrate resting on a support. The sample was preferably mounted at approximately a 45 degree angle to the horizontal. The chamber was then brought to a temperature of 85° C. and relative humidity of 85%. These conditions were maintained for 1000 hours, after which the samples were removed and tested.

Peel Strength Test

The laminated sample (glass/encapsulant/flexible backsheet, 4 inches by 6 inches) was prepared. The encapsulant and flexible backsheet was scored into three one inch by six inch strips. A one inch by four inch telflon strip had been placed between the encapsulant and the glass prior to lamination to provide one inch by one inch of unbonded encapsulant and backsheet (after scoring). The unbonded portion of the back sheet was clamped to a one inch by six inch piece of tape. The tape was placed in one grip of an Instru-Met load frame (Model 1122, available from the Instru-Met Corporation of Union, N.J.). The laminated sample was placed in the other Instru-Met grip. The unbonded portion of the flexible backsheet was bent at an angle of 180° to the laminate, that is, until it nearly made contact with itself. Care was taken to align the free part of the section so that it overlapped the laminated part of the section. This geometry is based on ASTM D903, a standard test used for pressure sensitive adhesives. The sample was pulled at a rate of 10 in/min, and the adhesion of the flexible sheet to the encapsulant was measured in units of lb force.

Examples 1 to 3

In Example 1, ACR-2 and EBAGMA-1 in a weight ratio of 60:40 were blended at 120° C. for 5 minutes in a Brabender mixer. The molar ratio between the acid group in ACR-2 and the glycidyl group in EBAGMA-1 is 3.5 to 1. The MI of the blend of the two ethylene copolymers was 70 g/10 min. Examples 2 and 3 were prepared similarly. The compositions are summarized in Table 1, in which the amount of each component in the composition is listed in "parts". Comparative Example C1 used Control EVA.

TABLE 1

| Component | C1 | 1 | 2 | 3 |
|---|---|---|---|---|
| Control EVA | 100 | | | |
| ACR-2 | | 60 | | |
| ACR-3 | | | 60 | 60 |
| EBAGMA-1 | | 40 | 40 | 40 |
| Z6040 Silane | | | | 0.5 |

Plaques having thickness of 30 mil were formed by compression molding portions of each blend at 120° C. for 5 minutes. Under these conditions, no crosslinking occurred.

The uncrosslinked plaques without silane or any other primers were laminated to test fluoropolymer sheets using a vacuum bag lamination method. The samples were placed inside a plastic bag with a fitting to a vacuum source. Sample size was four inches by six inches. Samples were positioned in the bag in order from the bottom up: first glass plate, sample second layer, fluorinated copolymer resin film, Teflon® release sheet and second glass plate. A small piece of Teflon® film release sheet was placed between the fluorinated copolymer resin film and the sample second layer at one end of the overlay to provide an unlaminated (unadhered) region to serve as an initiation point for subsequent peel tests. The bag was sealed, placed inside an oven and evacuated. The evacuated bag was heated from ambient to 140° C. (oven set temperature) over a 15-minute period and held for 5 minutes. The oven temperature was then brought to 170° C. and held for 10 minutes. At that time the oven heat was turned off and the sample was cooled to ambient temperature by opening the oven door. The heating not only laminated the second layer to the fluorinated copolymer film and the adjacent glass plate, but it also crosslinked the second layer.

The adhesion between the second layer and the fluoropolymer film was tested by a 180 degree peel test as described above, initially after lamination and after damp heat treatment for a designated time as described above. The adhesion results are summarized in Tables 2, 3, 4 and 5. In Tables 3 and 4, "Nonpeelable" indicates that the layers could not be peeled apart without destruction of the fluoropolymer layer.

TABLE 2

Initial Adhesion

| Ex. | ETFE-1 Mean | FEP-1 Mean | FEP-2 Mean |
|---|---|---|---|
| C1 | 24.28 | 14.34 | 14.7 |
| 1 | 24.39 | 11.08 | 19.47 |
| 2 | 22.59 | 14.04 | 17.82 |
| 3 | 26.80 | 11.48 | 14.16 |

TABLE 3

Adhesion after 264 hours damp heat treatment

| Ex. | ETFE-1 | FEP-1 | FEP-2 |
|---|---|---|---|
| C1 | Nonpeelable | No adhesion | Nonpeelable |
| 1 | Nonpeelable | Nonpeelable | Nonpeelable |

TABLE 3-continued

Adhesion after 264 hours damp heat treatment

| Ex. | ETFE-1 | FEP-1 | FEP-2 |
|---|---|---|---|
| 2 | Nonpeelable | Nonpeelable | Nonpeelable |
| 3 | Nonpeelable | Nonpeelable | Nonpeelable |

TABLE 4

Adhesion after 600 hours damp heat treatment

| Ex. | ETFE-1 | FEP-1 | FEP-2 |
|---|---|---|---|
| C1 | Nonpeelable | No adhesion | Nonpeelable |
| 1 | Nonpeelable | Nonpeelable | Nonpeelable |
| 2 | Nonpeelable | Nonpeelable | Nonpeelable |
| 3 | Nonpeelable | Nonpeelable | Nonpeelable |

TABLE 5

Adhesion after 1024 hours damp heat treatment
(values in lb/in, at 180 degrees, 10/in/min)

| Ex. | ETFE-1 | FEP-1 | FEP-2 |
|---|---|---|---|
| C1 | 8.2 | ~1[(1)] | ~4[(2)] |
| 1 | 7.8 | 7.0 | 10.6 |
| 2 | 11.0 | 8.0 | 9.0 |
| 3 | 21.9 | 15.2 | 17.4 |

[(1)]essentially no adhesion
[(2)]weak adhesion

Certain features of the invention which are, for clarity, described herein in the context of separate embodiments, may also be provided in combination in a single embodiment. Conversely, various features of the invention that are, for brevity, described in the context of a single embodiment, may also be provided separately or in any sub-combination.

While certain of the preferred embodiments of this invention have been described and specifically exemplified above, it is not intended that the invention be limited to such embodiments. Various modifications may be made without departing from the scope and spirit of the invention, as set forth in the following claims.

The invention claimed is:

1. A transparent multilayer film comprising:
   A. a first film layer comprising a fluorinated copolymer resin composition wherein i) the fluorinated copolymer comprises copolymerized units of tetrafluoroethylene and copolymerized units of comonomers selected from the group consisting of ethylene, perfluorinated comonomer, and combinations thereof, and ii) at least one surface of the first film layer has been modified by a surface treatment; and
   B. a second film layer consisting essentially of a blend composition, said blend composition consisting essentially of an Ethylene Copolymer 1 and an Ethylene Copolymer 2; wherein said Ethylene Copolymer 1 consists essentially of copolymerized units of ethylene; optionally copolymerized units of a first olefin having a formula of $CH_2=C(R^1)CO_2R^2$; and copolymerized units of a second olefin having a formula of $CH_2=C(R^3)COOH$; and
   wherein said Ethylene Copolymer 2 consists essentially of copolymerized units of ethylene; optionally copolymerized units of the first olefin; and copolymerized units of a third olefin having a formula of $CH_2=C(R^3)D$;
   wherein $R^1$ represents hydrogen or an alkyl group; $R^2$ represents an alkyl group; $R^3$ represents hydrogen or an alkyl group; and D represents a moiety selected from the group consisting of $—CO_2R^4$, $—CO_2R^5—R^4$, $—R^5—R^4$, $—O—R^4$, and $—R^4$, wherein $R^4$ represents a moiety containing an epoxy group and $R^5$ represents an alkylene group;
   wherein a surface of the second film layer is adhered to the modified surface of the first film layer and the multilayer film laminate has an average peel strength between the first film layer and the second film layer of greater than 5 lbf/in, measured after exposing the multilayer film laminate to conditions of 85° C. and 85% relative humidity for 1000 hours.

2. The transparent multilayer film of claim 1, wherein the blend composition is at least partially crosslinked.

3. The transparent multilayer film of claim 1 wherein $CH_2=C(R^1)CO_2R^2$ is butyl acrylate and D is $—CO_2H$.

4. The transparent multilayer film of claim 1 wherein $CH_2=C(R^1)CO_2R^2$ is butyl acrylate and D is selected from the group consisting of $—CO_2R^4$, $—CO_2R^5—R^4$, $—R^5—R^4$, $—O—R^4$, and $—R^4$.

5. The transparent multilayer film of claim 1 wherein $CH_2=C(R^3)D$ is glycidyl methacrylate.

6. A method for preparing the transparent multilayer film of claim 1, said method comprising the steps of:
   A. providing the first film layer;
   B. providing the second film layer;
   C. contacting a surface of the second film layer with the modified surface of the first film layer; and
   D. adhering the first film layer to the second film layer by the application of heat and optionally pressure or vacuum.

7. The method of claim 6 wherein the at least one surface of the first film layer is modified with an aminosilane.

8. A method for preparing a photovoltaic module, the method comprising the steps of:
   A. providing a solar cell layer;
   B. providing the multilayer film laminate according to claim 1, wherein said multilayer film laminate is larger in area than the solar cell layer;
   C. overlaying the solar cell layer with the multilayer film laminate such that
      1. the surface of the second layer of the multilayer film laminate contacts the solar cell layer;
      2. a portion of the second layer of the multilayer film laminate extends beyond the perimeter of the solar cell layer; and
      3. the portion of the second layer of the multilayer film laminate that extends beyond the perimeter of the solar cell layer contacts another layer that is an encapsulant layer; and
   D. adhering the second layer of the multilayer film laminate to the encapsulant layer by the application of heat and optionally pressure or vacuum to provide a photovoltaic module.

9. The method of claim 8 wherein the encapsulant layer comprises a polymeric material selected from the group consisting of ethylene acid copolymers, ionomers of ethylene acid copolymers, ethylene vinyl acetate copolymers, poly(vinyl acetals), polyurethanes, polyvinylchlorides, polyethylenes, polyolefin block copolymer elastomers, copolymers of α-olefins and α,β-ethylenically unsaturated carboxylic acid esters, silicone elastomers, epoxy resins, and combinations of two or more thereof.

10. The method of claim 8 wherein an additional layer is adhered to the surface of the encapsulant layer opposite the surface that contacts portions of the surface of the second layer.

11. The method of claim 8 wherein the photovoltaic module is characterized by having an average peel strength between the first film layer and the second film layer of greater than 10 lbf/in, measured after exposing the photovoltaic module to conditions of 85° C. and 85% relative humidity for 1000 hours.

12. The method of claim 11 wherein the surface of the first film layer that is in contact with the second film layer is modified with an aminosilane.

13. A photovoltaic module comprising the transparent multilayer film of claim 1.

14. The photovoltaic module of claim 13, wherein the blend composition is at least partially crosslinked.

* * * * *